United States Patent
Hollar

(10) Patent No.: US 10,778,144 B2
(45) Date of Patent: Sep. 15, 2020

(54) METHODS FOR CORRECTING OSCILLATOR OFFSETS IN ULTRA-WIDEBAND (UWB) NETWORKS

(71) Applicant: Wiser Systems, Inc., Raleigh, NC (US)

(72) Inventor: Seth Edward-Austin Hollar, Raleigh, NC (US)

(73) Assignee: Wiser Systems, Inc., Raleigh, NC (US)

( * ) Notice: Subject to any disclaimer, the term of this patent is extended or adjusted under 35 U.S.C. 154(b) by 0 days.

(21) Appl. No.: 16/229,243

(22) Filed: Dec. 21, 2018

(65) Prior Publication Data

US 2019/0199286 A1 Jun. 27, 2019

Related U.S. Application Data

(60) Provisional application No. 62/609,537, filed on Dec. 22, 2017.

(51) Int. Cl.
| | |
|---|---|
| *H03B 5/04* | (2006.01) |
| *H01Q 5/25* | (2015.01) |
| *G06F 1/08* | (2006.01) |
| *H04L 7/00* | (2006.01) |
| *H04B 17/12* | (2015.01) |
| *H01Q 3/00* | (2006.01) |

(52) U.S. Cl.
CPC .................. *H03B 5/04* (2013.01); *G06F 1/08* (2013.01); *H01Q 5/25* (2015.01); *H04B 17/12* (2015.01); *H04L 7/0012* (2013.01); *H01Q 3/005* (2013.01)

(58) Field of Classification Search
CPC ....................................................... H03B 5/04
USPC ......................................................... 331/176
See application file for complete search history.

(56) References Cited

U.S. PATENT DOCUMENTS

| | | | |
|---|---|---|---|
| 7,492,316 B1 | 2/2009 | Ameti et al. | |
| 7,764,133 B1 | 7/2010 | Nicholls | |
| 2010/0150013 A1* | 6/2010 | Hara | ............. H04L 25/0224 370/252 |
| 2010/0220827 A1 | 9/2010 | Yanagidate | |

OTHER PUBLICATIONS

Notification of Transmittal of the International Search Report and the Written Opinion of the International Searching Authority, or the Declaration, PCT/US2018/067129, dated May 20, 2019, 16 pages.

* cited by examiner

*Primary Examiner* — Joseph Chang
(74) *Attorney, Agent, or Firm* — Stanek Lemon Crouse & Meeks, PA

(57) ABSTRACT

Methods for calibrating antenna oscillators are provided including initiating a clock offset process from a primary antenna with a remote antenna within a radio frequency (RF) range of the primary antenna to determine a clock offset between the primary antenna and the remote antenna; calculating a temperature difference between a primary temperature of the primary antenna and a temperature of the remote antenna; and instructing the remote antenna to adjust a clock frequency of the remote antenna based on the determined clock offset and the calculated temperature.

10 Claims, 6 Drawing Sheets

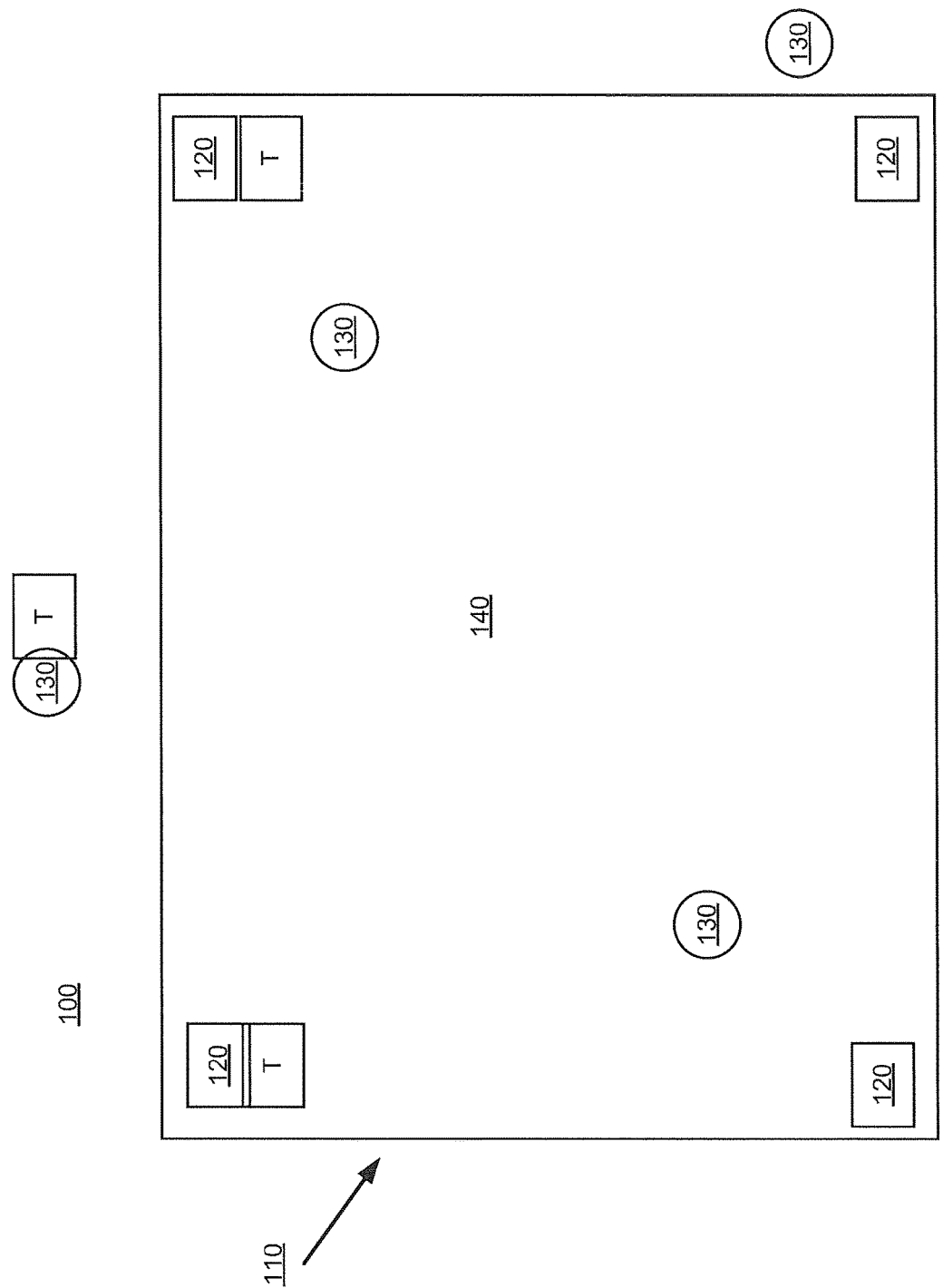

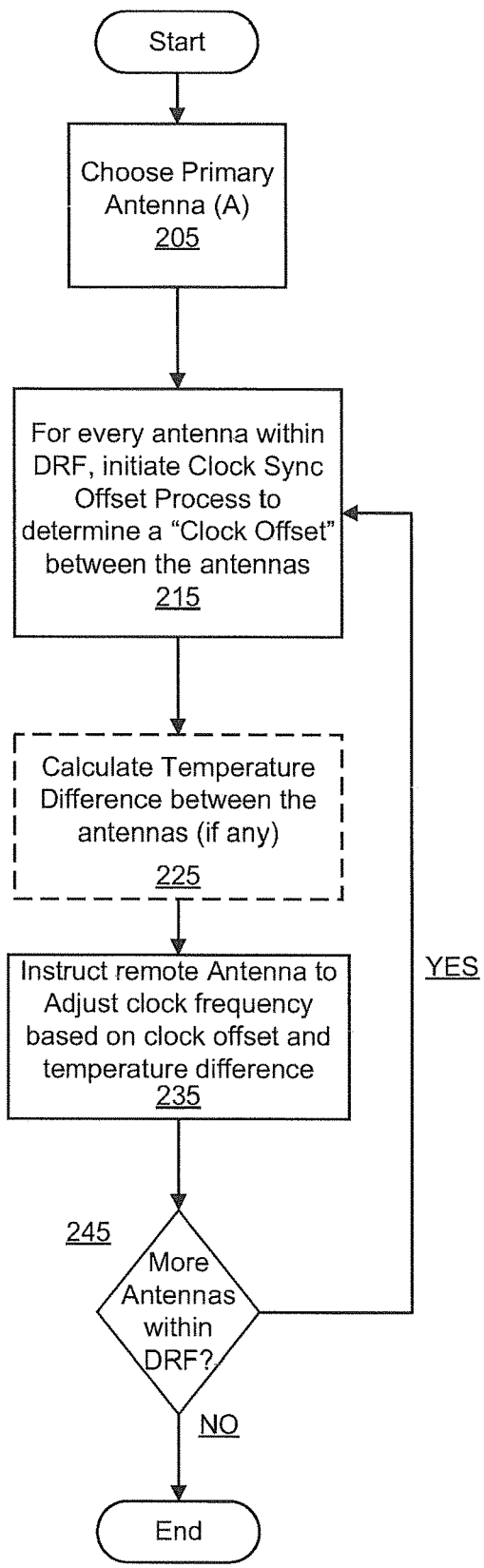
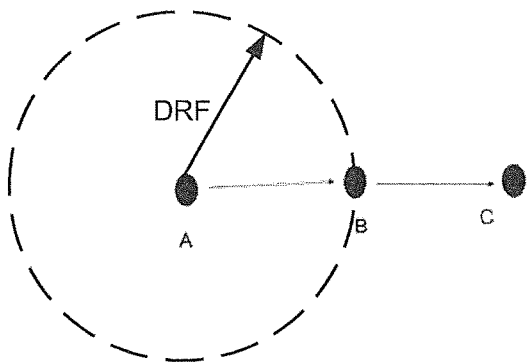
Fig. 2B
Fig. 2A

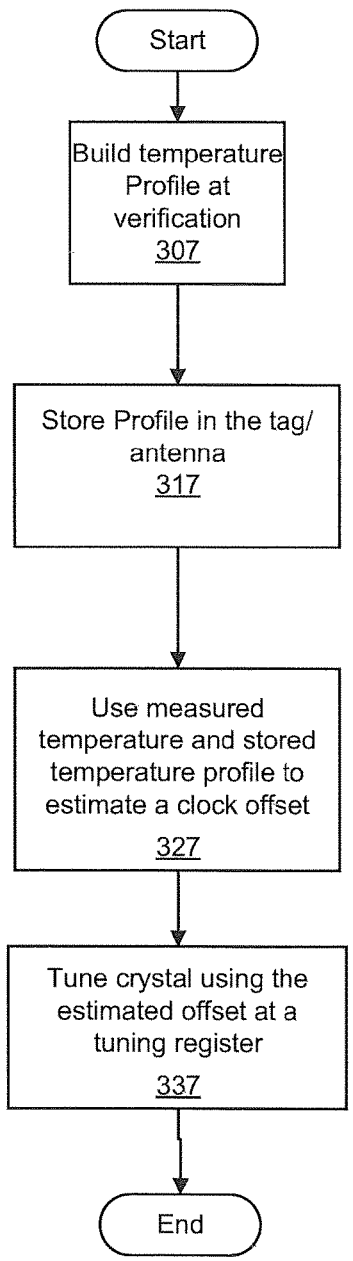
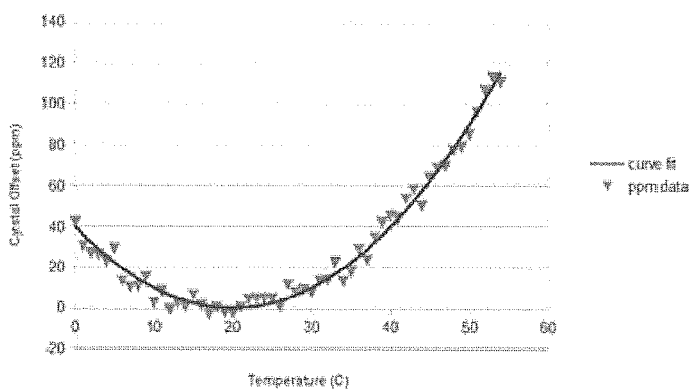
Fig. 3B
Fig. 3A $$T_{difference-A} = T_{arrival-A-2} - T_{arrival-A-1}$$

$$T_{difference-b} = T_{departure-B-2} - T_{departure-B-1}$$

$$Clock_{offset} = 1 - (T_{difference-b} / T_{difference-A})$$

METHODS FOR CORRECTING OSCILLATOR OFFSETS IN ULTRA-WIDEBAND (UWB) NETWORKS

CLAIM OF PRIORITY

The present application claims priority to U.S. Provisional Application No. 62/609,537, filed on Dec. 22, 2017, entitled Methods for Correcting Oscillator Offsets in Ultra-Wideband (UWB) Networks, the contents of which is hereby incorporated herein by reference as if set forth in its entirety.

FIELD

This present inventive concept relates generally antennas and, more particularly, to ultra-wideband systems and related methods and computer program products.

BACKGROUND

In the early 2000s, ultra-wideband (UWB) was cited as a promising technology as "wireless universal serial bus (USB)." However, the market turned in a different direction. Nonetheless, the groundwork from the Federal Communications Commission (FCC) was laid so that devices could operate legally in the United States and abroad. Until recently, UWB devices operating in the 3.1 to 10 GHz range tended to be composed of discrete components having a relatively high price point. Recently, however, UWB integrated circuit (IC) chips have come into the marketplace allowing for lower cost UWB transceivers to be built and sold. With the lower price point, these devices may reach a broader audience with greater manufacturing quantities.

Inherent in UWB technology is the ability to create narrow pulse widths. These pulse widths can be used to establish an arrival time of a radio frequency (RF) signal with very high granularity. A precise timestamp can be determined for receiving a signal and transmitting a signal. When timestamps are compared for a message that is sent from one device to the next, a distance between devices can be calculated based on the difference in time and the speed of the signal through the air (Time-difference-of-Arrival or TDOA).

For determining location using TDOA, the devices typically need to be synchronized to a master clock. Crystal oscillators are used in a wide variety of electronics and can serve as a precision clock in ultra-wideband (UWB) applications/electronics. The crystal oscillator may serve as the critical timing element for determining a precise frequency of transmitted messages and for sampling incoming radio frequency (RF) messages.

Crystal oscillators generally have limited tolerances and can typically range in accuracy from about 5.0 to 40 parts per million (ppm). In UWB applications, depending on data rate and carrier frequency, the clock generally needs to have tolerances of less than about 10.0 parts per million (ppm) or greater for reliable communication. Furthermore, temperature may also play a role with crystals deviating from their nominal frequency. If the temperature is too high or too low from relative to room temperature, the frequency of the crystal may deviate.

SUMMARY

Some embodiments of the present inventive concept provide methods for calibrating antenna oscillators including initiating a clock offset process from a primary antenna with a remote antenna within a radio frequency (RF) range of the primary antenna to determine a clock offset between the primary antenna and the remote antenna; and instructing the remote antenna to adjust a clock frequency of the remote antenna based on the determined clock offset. At least one of the initiating and instructing is implemented by at least one processor.

In further embodiments, a temperature difference between a primary temperature of the primary antenna and a temperature of the remote antenna is calculated and is used to adjust the clock frequency.

In still further embodiments, the method may further include determining if any additional antennas are within the RF range of the primary antenna; and repeating the initiating, the calculating and the instructing for the determined additional antennas until it is determined that there are no additional antennas within the RF range of the primary antenna.

In some embodiments, instructing the remote antenna to adjust a clock frequency of the remote antenna may include transmitting a message from the primary antenna to the remote antenna instructing the remote antenna to apply a hardware tuning offset to the clock frequency of a crystal associated with the remote antenna.

In further embodiments, the method may further include determining if there are any antennas out of RF range of the primary antenna but within RF range of the remote antenna; and repeating the initiating, the calculating and the instructing from the remote antenna for the antennas determined to be out of RF range of the primary antenna but within RF range of the remote antenna.

In still further embodiments, the RF range may be from about 25 feet to about 500 feet.

In some embodiments, the primary and remote antennas may be positioned in an ultra-wideband (UWB) communications network.

Further embodiments of the present inventive concept provide methods for estimating a clock offset using a temperature difference between devices in a network including building a temperature profile for a crystal associated with a device, the temperature profile associating temperature and clock offset; storing the temperature profile at the device; measuring an actual temperature of the device in the network; estimating the clock offset based on the measured actual temperature and the stored temperature profile; and tuning the crystal associated with the device using the estimated clock offset.

In still further embodiments, the temperature profile may indicate that as the clock offset increases, the temperature is squared.

Some further embodiments provide methods of calibrating a crystal oscillator, the method comprising transmitting first and second messages from a first device in the network to a second device in the network, first and second times of departure for the first and second messages, respectively, being recorded and a time departure difference being communicated to the second device; receiving the first and second messages at the second device and recording first and second arrival times, respectively; calculating a time difference of arrival based on the recorded first and second arrival times; calculating a clock offset based on the time departure difference and the time difference of arrival; and communicating the calculated clock offset to the first device from the second device.

BRIEF DESCRIPTION OF THE DRAWINGS

FIG. 1 is a block diagram of an example environment for operating methods in accordance with some embodiments of the present inventive concept.

FIG. 2A is a flowchart illustrating operations for calibrating antenna oscillators in accordance with some embodiments of the present inventive concept.

FIG. 2B is a diagram illustrating antennas in a network in accordance with some embodiments of the present inventive concept.

FIG. 3A is a flowchart illustrating operations for estimating offsets oscillators in accordance with some embodiments of the present inventive concept.

FIG. 3B is a graph illustrating modeling frequency offset with temperature in accordance with some embodiments of the present inventive concept.

DETAILED DESCRIPTION

Figure 4:
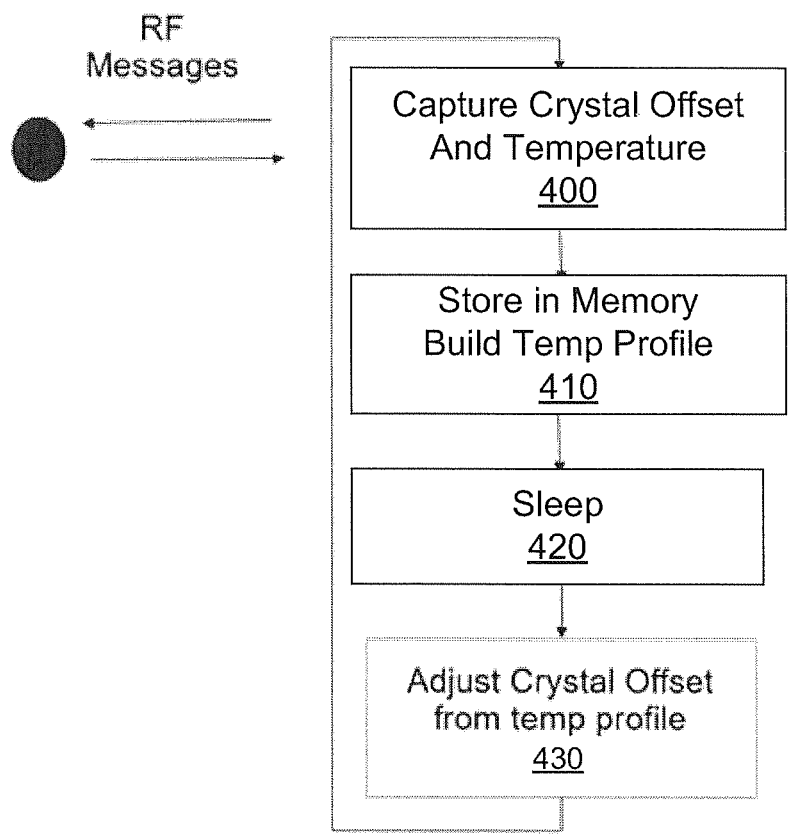
FIG. 4 is a flowchart illustrating a combination of methods of FIGS. 2A through 3B in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed in the background, crystal oscillators are used in a wide variety of electronics and can serve as a precision clock in time critical applications. For example, in ultra-wideband (UWB) applications/electronics, the crystal oscillator may serve as the critical timing element for determining a precise frequency of transmitted messages and for sampling incoming radio frequency (RF) messages.

Crystal oscillators generally have limited tolerances and can typically range in accuracy from about 5.0 to 40 parts per million (ppm). In UWB applications, depending on data rate and carrier frequency, the clock generally needs to have tolerances of less than about 10.0 ppm or greater for reliable communication. Furthermore, temperature also plays a role with crystals deviating from their nominal frequency. If the temperature is too high or too low from relative to room temperature, the frequency of the crystal may deviate.

For example, in an environment where there are two types of RF devices: antennas and associated tags. In this (UWB) environment, antennas are generally in a known location in the environment and may be spaced from about 50 to about 100 feet apart. The locations of the tags are generally not known beforehand. The tags are configured to transmit an RF signal or "ping" that is received by the antennas. The tags location can then be determined using, for example, time difference of arrival (TDOA) methods.

It will be understood that the terms "antenna" and "tag" are used herein as separate and distinct devices, these devices may be combined in some embodiments. For example, a combination antenna and tag may be provided without departing from the scope of the present inventive concept.

If the temperature rises and falls equally within the environment, the crystal offsets collectively rise and fall, so the difference in crystal frequencies among the antennas and tags is not the great. However, if there is a large temperature difference between the tags and antennas, or from antenna to antenna, then the difference in crystal offsets could adversely affect performance of the system. This scenario may happen, for example, if antennas are indoors tracking tags that are outdoors or if one or more the devices is in a freezer or furnace in the facility. Accordingly, some embodiments of the present inventive concept provide methods for correcting oscillator offsets in UWB networks where these adverse environmental conditions may have an effect on the performance of the system/network as will be discussed further below with respect to FIGS. 1 through 6.

Referring first to FIG. 1, an example environment including antennas, tags and combination devices where embodiments of the present inventive concept may be used will be discussed. It will be understood that this environment is provided as example only and that embodiments of the present inventive concept are not limited thereto. Furthermore, although methods herein are discussed specifically with respect to UWB networks, embodiments of the present inventive concept may be used with other types of networks where feasible.

As illustrated in FIG. 1, the environment 100 may include a building or structure 110, one or more antenna (or combination antenna/tags) 120 and one more tags 130 moving around the structure. The tags can be affixed to any moving object, for example, equipment, inventory, personnel and the like. The network 140 created by the antennas 120 can be used to specifically pinpoint the location of the moving object at any point in time. It will be understood that antennas may be installed in a completely outdoor environment without departing from the scope of the present inventive concept. In some embodiments, the tags 120, antennas and/or combination devices 130 include a temperature sensor T thereon.

Referring now to FIGS. 2A and 2B, methods for calibrating antenna oscillators in accordance with some embodiments of the present inventive concept will be discussed. As illustrated in FIG. 2A, methods for calibrating antenna oscillators begin by at block 205 by choosing a primary antenna, antenna A of FIG. 2B in this scenario. In these embodiments, it is assumed that antenna A has a crystal oscillator at the "true frequency." As used herein, "true frequency" refers to a master oscillator from which all other devices are tuned. Generally, this oscillator will be assumed to be highly accurate with a very low parts per million (PPM) deviation compared to other devices. For some antennas within a radio frequency (RF) range of antenna A of FIG. 2B, in other words, some antennas within A's RF reach ($D_{RF}$), operation continue to block 215 where a "clock sync offset" process is performed. In some embodiments, antennas within A's RF reach ($D_{RF}$) may be from 25 feet to about 500 feet from antenna A. However, embodiments of the present inventive concept are not limited to this distance. Smaller or larger distances for $D_{RF}$ may be used without departing from the scope of the present inventive concept.

The term $D_{RF}$ is used herein as a convenient way to refer to antennas that are with a certain range of antenna A. It will be understood that due to obstacles, some antennas may not be considered with RF range of communication even if they are within technically within $D_{RF}$. Furthermore, other antennas whose distance is technically greater than $D_{RF}$ may be considered within range depending on the environment in which the antennas exist. Thus, whether or not an antenna is within range of the Antenna A not only includes a consideration of distance between the antennas, but the environment in which the antennas exist. Thus, the antennas that are considered "within range" of Antenna A may also be referred to a "group of antennas" that can communicate with Antenna A. The group of antennas will generally be close to antenna A, but not always.

A "clock sync offset process" 215 may be initiated between antennas A and B of FIG. 2B by sending and receiving messages in quick succession to and from the two antennas (A & B) to determine the relative "clock offset" between them. If the time between the two messages is too large, the offsets between the crystals can degrade the calculation of the clock offset. As used herein, a "clock offset" refers to the difference between Antenna A's clock (the clock chosen as having the true frequency) and Antenna B's Clock (a clock of an antenna within $D_{RF}$ of A, herein B). A temperature difference may be calculated between antennas A and B, if any. As discussed above, the antennas (A and B) may be in different environments having different temperatures. If the location of the antennas have different temperatures, a temperature difference is calculated (block 225). Block 225 is optional as indicated by the dotted lines. In some embodiments, there is no temperature difference or it may not be calculated. Using the determined clock offset and temperature difference (if any) between the locations of the two antennas (A & B), Antenna R may be instructed to adjust the frequency of the crystal accordingly (block 235). For example, a message may be sent to Antenna "B" to apply a hardware tuning offset to the crystal. This may be done at the microcontroller units (MCUs) and/or transceivers that generally include the ability to change the offset frequency of the oscillator through, for example, a tuning register in the digital storage of the device.

It is then determined if other Antenna's within $D_{RF}$ need to be "tuned" (block 245). If it is determined that other antenna's need to be tuned (block 245), these antennas can be tuned relative to A. In particular, operations return to block 215 and repeat until it is determined that no more antennas need to be tuned (block 245).

It will be understood that some of the other antennas may not be reachable (out of range $D_{RF}$) to Antenna A, for example, Antenna C in FIG. 2B. In these embodiments, an antenna reachable from Antenna A, for example, Antenna B may be used to tune the unreachable antennas. For example, Antenna C may not reachable directly by Antenna A, but may be reachable by Antenna B. Since Antenna B is tuned to have the same frequency as Antenna A, method discussed above with respect to FIGS. 2A and 2B may be used to tune Antenna C (and the rest of the unreachable antennas) as long as all the antennas in a group can communicate with each other through one or more hops.

Referring now to FIGS. 3A and 3B, methods for using temperature to estimate clock offset in accordance with some embodiments of the present inventive concept will be discussed. FIG. 3A is a flowchart illustrating operations in accordance with some embodiments and FIG. 3B is a graph illustrating modeling frequency offset with temperature in accordance with some embodiments of the present inventive concept will be discussed. Methods illustrated and discussed with respect to FIGS. 3A and 3B discuss the estimation and internal correction of crystal offsets among tags and antennas in accordance with some embodiments of the present inventive concept.

Referring to FIG. 3A, operations for estimating an offset based on temperature begin at block 307 by building a temperature profile for the antenna/tag. FIG. 3B illustrates a graph of crystal offset in PPM versus temperature in Celsius (C). There is a known relationship between temperature and clock offsets. For example, temperature models for crystals are well known and clock offsets generally go up as the temperature is squared. When antennas and tags are being tested during the verification step, a temperature profile of the crystal may be built with three or more data points. As used herein, the temperature profile associates a crystal frequency over temperature. Once built for a particular crystal, the temperature profile may be stored in, for example, a processing unit of the tag and/or antenna (block 317). As discussed above, some tags/antennas may include a temperature sensor T therein. To tune for the frequency, the central processing unit (CPU) may be configured to measure the current temperature and use the measured temperature and the stored temperature profile to estimate the crystal offset (block 327). For example, referring to FIG. 3B on the graph, suppose the correct operation of the crystal is at 0 ppm. During typical use, the temperature of the device can change. At one point, the temperature is 20° C. Looking at the graph, 20° C. gives a crystal offset of 0 ppm. In this case, the controller will set the tuning register so that an offset of 0 ppm is produced. In another scenario, suppose the temperature is 50° C. According to the graph of FIG. 3B, this creates a crystal offset of 80 ppm. To counteract the crystal offset, the controller will compensate by setting the tuning register so that an offset of −80 ppm is produced. Once the offset is estimated, the crystal may be tuned to zero out the estimated offset by setting the tuning register of the antenna or tag (block 337).

Referring now to FIG. 4, a flowchart illustrating operations combining the methods discussed above in accordance with some embodiments of the present inventive concept will be discussed. It may be possible to build the temperature profile using methods discussed above and store the same at the antenna/tag. Once the temperature offsets are determined between two antennas as discussed above, the temperature can be measured as well (block 400). These offsets and temperatures can be stored over time in the processing unit of the antennas and/or tags (block 410). With multiple data points, a temperature profile can be determined automatically within the processing unit of the antennas and/or tags (block 410). In some embodiments, the tags may sleep (block 420). The crystal offset may be adjusted based on the temperature profile (block 430). Using a combination of the methods discussed with respect to FIGS. 2A through 3B may reduce the number of times methods associated with FIGS. 2A and 2B may have to be performed, which could save in power for the tags, reduce the bandwidth requirements for RF communication and the like.

Figure 5:
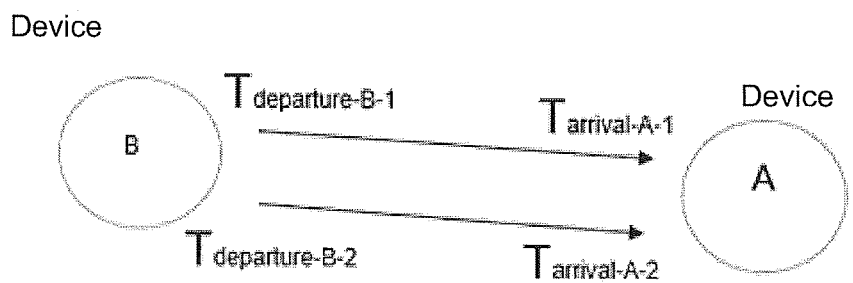
FIG. 5 is a diagram illustrating operations for calibrating devices using transmission and reception times of messages from/to the devices in accordance with some embodiments of the present inventive concept.

In some embodiments, devices, for example, tags/antennas may be calibrated by transmitting and receiving messages between them. For example, although tags generally send out a transmission for TDOA operation, in some embodiments, tags occasionally perform a "clock sync offset" process with another antenna/tag. Operations for calibration between any two devices will now be discussed with respect to the diagram of FIG. 5. As illustrated in FIG. 5, a first device B transmits two packets at two different times, $T_{departure-B-1}$ and $T_{departure-B-2}$, to device A. The difference in time between transmissions, $T_{difference-B}$, is either known or calculated and sent in the second packet. Time (relative to B) is denoted as $T_{departure-B-1}$ and $T_{departure-B-2}$, respectively. As used herein, the device can be any device in the system, tag, antenna or combination thereof. Device A receives both packets with arrival times relative to B's clock of $T_{arrival-A-1}$ and $T_{arrival-A-2}$, respectively. As discussed above, it is not important for $T_{departure-B-1}$ and $T_{departure-B-2}$ to be known by Antenna A, but it is important that $T_{difference-B}$ be known (either decided a priori or sent in one of the packets) to Device B. Then Device A can calculate Device B's clock offset as follows:

$$T_{difference-A} = T_{arrival-A-2} - T_{arrival-A-1} \quad \text{Eqn. (1)}$$

$$T_{difference-b} = T_{departure-B-2} - T_{departure-B-1} \quad \text{Eqn. (2)}$$

$$\text{Clock}_{offset} = 1 - (T_{difference-b} / T_{difference-A}) \quad \text{Eqn. (3)}$$

Once the $\text{Clock}_{offset}$ if determined, Device A sends the Offset back to Device B so that Device B can adjust its clock. Using this method, the network knows the frequency offset. The next time a device, for example, a tag "wakes up", the antenna/tag can send the frequency offset to the tag. The tag can then adjust/tune its crystal frequency to align with the frequency of the antenna network.

Figure 6:
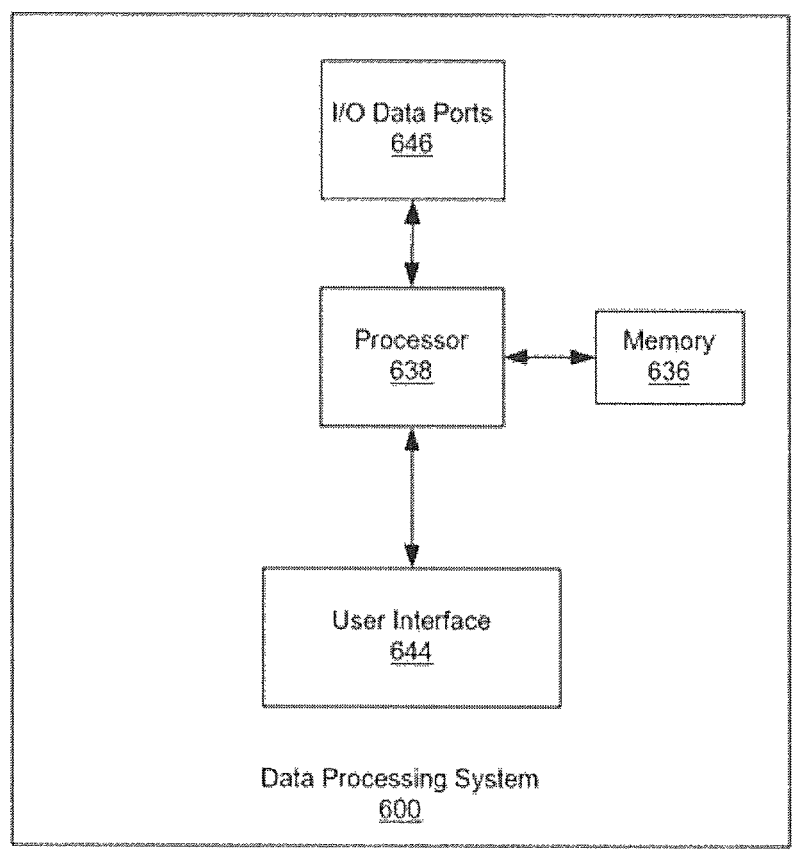
FIG. 6 is a block diagram of a data processing system that may be used in accordance with some embodiments of the present inventive concept.

As discussed above, embodiments of the present inventive concept utilize processors and storage to implement the methods discussed herein. FIG. 6 is an example data processing system 600 that can in be included any device associated with the antennas/tags in accordance with embodiments of the present inventive concept. Referring now to FIG. 6, a data processing system 600 may be included any element of the system 100 without departing from the scope of the present inventive concept. As illustrated in FIG. 6, an exemplary embodiment of a data processing system 600 suitable for use in the system 100 of FIG. 1 includes a user interface 644 such as a keyboard, keypad, touchpad or the like, I/O data ports 646 and a memory 636 that communicates with a processor 638. The I/O data ports 646 can be used to transfer information between the data processing system 600 and another computer system or a network. These components may be conventional components, such as those used in many conventional data processing systems, which may be configured to operate as described herein.

Example embodiments are described above with reference to block diagrams and/or flowchart illustrations of methods, devices, systems and/or computer program-products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), or microcontroller.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed example embodiments of the inventive concept. Although specific terms are employed, they are used in a generic and descriptive sense only and not for purposes of limitation, the scope of the inventive concept being defined by the following claims.

What is claimed is:

1. A method for tuning a oscillator of a remote ultra-wideband (UWB) device, the method comprising:
    initiating a clock offset process from a primary UWB device having a true clock reference with a remote UWB device within a radio frequency (RF) range of the primary UWB device to determine a clock offset between the primary UWB device and the remote UWB device; and
    instructing the remote UWB device to adjust a frequency of an oscillator of the remote UWB device based on the determined clock offset to the primary UWB device, wherein determining a clock offset between the primary UWB device and the remote UWB device comprises:
        transmitting first and second messages from the primary UWB device to the remote UWB device; and
        receiving the first and second messages from the remote device, wherein a departure time in primary UWB device clock units is known and an arrival time in remote UWB clock units is known; and
    wherein at least one of the initiating and instructing and determining is implemented by at least one processor.

2. The method of claim 1, further comprising:
    calculating a temperature difference between a primary temperature of the primary UWB device and a temperature of the remote UWB device; and
    instructing the remote UWB device to adjust a clock frequency of the remote UWB device further based on the calculated temperature.

3. The method of claim 2, further comprising:
    determining if any additional UWB devices are within the RF range of the primary UWB device; and
    repeating the initiating, the calculating and the instructing for the determined additional UWB devices so that all UWB devices have been tuned to the true clock reference until it is determined that there are no additional antennas within the RF range of the primary UWB device.

4. The method of claim 2, wherein instructing the remote UWB device to adjust a clock frequency of the remote UWB device further comprises transmitting a message from the primary UWB device to the remote UWB device instructing the remote UWB device to apply a hardware tuning offset to the clock frequency of a crystal associated with the remote UWB device.

5. The method of claim 2, further comprising:
    determining if there are any UWB device out of RF range of the primary UWB device but within RF range of the remote UWB device; and
    repeating the initiating, the calculating and the instructing from the remote UWB device for the UWB devices determined to be out of RF range of the primary UWB device but within RF range of the remote UWB device.

6. The method of claim 1, wherein the RF range indicates a distance to UWB devices within an RF reach ($D_{RF}$) of the primary UWB device and wherein the $D_{RF}$ is from about 25 feet to about 500 feet.

7. The method of claim 1, wherein the primary and remote UWB devices are positioned in an ultra-wideband (UWB) communications network.

8. The method of claim 1, further comprising:
    building a temperature profile for a crystal associated with one of the primary and remote UWB devices, wherein the temperature profile associates temperature and clock offset;
    storing the temperature profile at the primary or remote UWB device;
    measuring an actual temperature of the primary or remote UWB device in a network;
    estimating the clock offset based on the measured actual temperature and the stored temperature profile; and
    tuning the frequency of an oscillator associated with the primary or remote UWB device using the estimated clock offset such that the frequency of the oscillator is tuned without communication between the primary UWB device and the remote UWB device, wherein at least one of the building, storing, measuring, estimating and tuning is implemented by at least one processor.

9. The method of claim 8, wherein the temperature profile indicates that as the clock offset increases, the temperature is squared.

10. The method of claim 1, wherein the UWB device comprises one of an antenna, a tag and combination antenna and tag.

\* \* \* \* \*